(12) United States Patent
Wang (10) Patent No.: US 10,192,607 B2
(45) Date of Patent: Jan. 29, 2019

(54) PERIODIC ZQ CALIBRATION WITH TRAFFIC-BASED SELF-REFRESH IN A MULTI-RANK DDR SYSTEM

(71) Applicant: QUALCOMM Incorporated, San Diego, CA (US)

(72) Inventor: Liyong Wang, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 162 days.

(21) Appl. No.: 15/273,256

(22) Filed: Sep. 22, 2016

(65) Prior Publication Data

US 2017/0345483 A1 Nov. 30, 2017

Related U.S. Application Data

(60) Provisional application No. 62/343,769, filed on May 31, 2016.

(51) Int. Cl.
*G06F 12/00* (2006.01)
*G11C 11/406* (2006.01)
(Continued)

(52) U.S. Cl.
CPC ...... *G11C 11/40615* (2013.01); *G06F 3/0619* (2013.01); *G06F 3/0659* (2013.01); *G06F 3/0683* (2013.01); *G06F 13/1636* (2013.01); *G06F 13/1689* (2013.01); *G11C 7/1057* (2013.01); *G11C 7/1072* (2013.01); *G11C 7/1084* (2013.01); *G11C 11/4093* (2013.01); *G11C 11/40603* (2013.01);
(Continued)

(58) Field of Classification Search
None
See application file for complete search history.

(56) References Cited

U.S. PATENT DOCUMENTS 8,549,217 B2 10/2013 Blackmon et al.
8,824,238 B2 9/2014 Chen et al.
(Continued)

OTHER PUBLICATIONS

International Search Report and Written Opinion—PCT/US2017/032421—ISA/EPO—dated Jul. 28, 2017.
JEDEC: "JEDEC Standard DDR4 SDRAM JESD79-4," Nov. 2013, Arlington, VA , 208 pages.

*Primary Examiner* — Mark A Giardino, Jr.
(74) *Attorney, Agent, or Firm* — Muncy, Geissler, Olds & Lowe, P.C.

(57) ABSTRACT

According to various aspects, a memory controller may schedule ZQ commands to periodically calibrate individual memory ranks in a multi-rank memory. The memory controller may schedule a ZQ short command at each ZQ interval and record that the ZQ short command was missed with respect to a memory rank in a self-refresh mode at the ZQ interval. After the missed ZQ short commands reaches a first threshold, a ZQ long command may be scheduled at the next ZQ interval and normal ZQ behavior may resume in the event that the memory rank exits the self-refresh mode and the ZQ long command is executed. However, if the memory rank stays in the self-refresh mode until missed ZQ long commands reaches a second threshold, the memory controller may trigger a ZQ long command once the memory rank exits the self-refresh mode and skip a next ZQ calibration before resuming normal ZQ behavior.

30 Claims, 6 Drawing Sheets

(51) Int. Cl.
  *G06F 3/06* (2006.01)
  *G06F 13/16* (2006.01)
  *G11C 7/10* (2006.01)
  *G11C 11/4093* (2006.01)
  *G11C 29/02* (2006.01)
  *G11C 29/50* (2006.01)
  *H04L 25/02* (2006.01)
  *G06F 13/00* (2006.01)
  *G06F 13/28* (2006.01)
  *G11C 29/44* (2006.01)

(52) U.S. Cl.
  CPC ............ *G11C 29/02* (2013.01); *G11C 29/022* (2013.01); *G11C 29/025* (2013.01); *G11C 29/028* (2013.01); *G11C 29/50008* (2013.01); *H04L 25/0278* (2013.01); *G11C 2029/4402* (2013.01); *G11C 2207/2254* (2013.01); *G11C 2211/4061* (2013.01)

(56) References Cited

U.S. PATENT DOCUMENTS

| | | | |
|---|---|---|---|
| 9,036,440 B2 | 5/2015 | Song | |
| 9,043,539 B2 | 5/2015 | Kaiwa et al. | |
| 9,189,050 B1 | 11/2015 | Greenberg | |
| 2007/0007992 A1* | 1/2007 | Bains | G11C 7/1051 326/30 |
| 2007/0148796 A1* | 6/2007 | Nakamura | G11C 7/1051 438/17 |
| 2009/0177849 A1* | 7/2009 | Mazzola | G06F 13/1684 711/154 |
| 2010/0005212 A1* | 1/2010 | Gower | G06F 13/4234 710/308 |
| 2013/0124795 A1* | 5/2013 | Sato | G06F 13/1636 711/106 |
| 2015/0310899 A1 | 10/2015 | Sato et al. | |
| 2017/0099050 A1* | 4/2017 | Lee | G11C 7/1057 |

* cited by examiner

PERIODIC ZQ CALIBRATION WITH TRAFFIC-BASED SELF-REFRESH IN A MULTI-RANK DDR SYSTEM

CROSS-REFERENCE TO RELATED APPLICATIONS

The present application claims the benefit of U.S. Provisional Patent Application Ser. No. 62/343,769, entitled "PERIODIC ZQ CALIBRATION WITH TRAFFIC-BASED SELF-REFRESH IN A MULTI-RANK DDR SYSTEM," filed May 31, 2016, the contents of which are hereby expressly incorporated by reference in their entirety.

TECHNICAL FIELD

The present disclosure generally relates to memory systems, and in particular, to managing operations to periodically calibrate a multi-rank memory system that supports a traffic-based self-refresh mode.

BACKGROUND

In double data rate (DDR) dynamic random-access memory (DRAM) technology, ZQ calibration commands are used to periodically calibrate the DRAM drive strength and termination values. For example, a memory controller may generally issue the ZQ calibration commands to compensate any system voltage and temperature (VT) variations in the input/output (I/O) drivers associated with the DRAM. One ZQ calibration command used to calibrate the DRAM is referred to as a ZQ "long" command, which is often used during power-up initialization and during reset conditions. In addition, another ZQ calibration command is referred to as a ZQ "short" command, which tends to be used to track minor variations in voltage and temperature during normal operation and to periodically calibrate the DRAM while idle to maintain a linear output driver and termination impedance over a full voltage and temperature range. The ZQ short command takes one hundred twenty-eight (128) DRAM clock cycles to complete, whereas the ZQ long command takes a longer time to complete, typically five hundred twelve (512) DRAM clock cycles. However, the ZQ long command can compensate larger voltage and temperature deviations relative to the last time that the ZQ calibration was run.

DDR DRAM also supports various low-power modes, including a self-refresh mode in which the DRAM can issue internal refreshes to preserve data stored therein. Because the self-refresh mode has a low power consumption (e.g., relative to an auto-refresh where the memory controller pre-charges and then refreshes all open rows), the DRAM may be configured to automatically enter the self-refresh mode to save power when there is no memory traffic. Because the DRAM self-refresh mode may depend on whether there is memory traffic, the self-refresh mode may also be called traffic-based self-refresh. However, the DRAM cannot serve ZQ calibration commands while in the self-refresh mode. Accordingly, one challenge is to handle the interaction between the periodic ZQ calibration and the traffic-based self-refresh mode, as there may not be a need to calibrate the DRAM during self-refresh because there is no traffic. However, in the event that a memory rank spends substantial time in the self-refresh mode because the memory rank does not receive any traffic, larger voltage and temperature variations may accumulate while the memory rank stays in the self-refresh mode. In such cases, memory access timing may deteriorate and a ZQ calibration may be necessary before any traffic can resume. Furthermore, another concern in managing ZQ calibration is that the data input/output (DQ) bus shared among all dual in-line memory modules (DIMMs) in a DDR channel needs to be stable during ZQ calibration. Accordingly, ZQ calibration can stall the entire memory channel, blocking traffic to all ranks, whereby the performance impact that ZQ calibration will contribute may increase with more ranks in the memory system. For example, in a multi-rank system such as a channel with two (2) DIMMs, each rank may enter and exit self-refresh mode independently based on the incoming memory traffic. In such a multi-rank system, the periodic ZQ calibration must be issued to each rank, thus increasing complexity with respect to how the periodic ZQ commands interact with the self-refresh mode in each rank.

As such, because ZQ calibration can take considerable time and substantially impact memory latency due to stalling the entire memory channel, techniques to increase the time that memory ranks spend in self-refresh mode and reduce channel stall time are desired to improve memory power consumption and performance.

SUMMARY

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

According to various aspects, a method for memory calibration may comprise scheduling a ZQ calibration short (ZQCS) command to calibrate a multi-rank double data rate (DDR) memory system according to a ZQ interval, recording that a dynamic random-access memory (DRAM) rank in the multi-rank DDR memory system missed the ZQCS command in response to determining that the DRAM rank was is in a self-refresh mode at the ZQ interval, and scheduling a ZQ command to calibrate the DRAM rank after exiting the self-refresh mode based at least in part on a number of ZQCS commands that were missed while the DRAM rank was in the self-refresh mode.

According to various aspects, an apparatus may comprise a double data rate (DDR) memory system comprising multiple dynamic random-access memory (DRAM) ranks and a memory controller coupled to the DDR memory system, wherein the memory controller may be configured to schedule a ZQ calibration short (ZQCS) command to calibrate the DDR memory system according to a ZQ interval, record that a DRAM rank among the multiple DRAM ranks in the DDR memory system missed the ZQCS command in response to determining that the DRAM rank was is in a self-refresh mode at the ZQ interval, and schedule a ZQ command to calibrate the DRAM rank after exiting the self-refresh mode based at least in part on a number of ZQCS commands that were missed while the DRAM rank was in the self-refresh mode.

According to various aspects, an apparatus may comprise means for scheduling a ZQ calibration short (ZQCS) command to calibrate a multi-rank double data rate (DDR) memory system according to a ZQ interval, means for recording that a dynamic random-access memory (DRAM) rank in the multi-rank DDR memory system missed the ZQCS command in response to determining that the DRAM rank was is in a self-refresh mode at the ZQ interval, and means for scheduling a ZQ command to calibrate the DRAM rank after exiting the self-refresh mode based at least in part on a number of ZQCS commands that were missed while the DRAM rank was in the self-refresh mode.

According to various aspects, a computer-readable storage medium may store computer executable code, which may comprise code for causing a memory controller to schedule a ZQ calibration short (ZQCS) command to calibrate a multi-rank double data rate (DDR) memory system according to a ZQ interval, record that a dynamic random-access memory (DRAM) rank in the multi-rank DDR memory system missed the ZQCS command in response to determining that the DRAM rank was is in a self-refresh mode at the ZQ interval, and schedule a ZQ command to calibrate the DRAM rank after exiting the self-refresh mode based at least in part on a number of ZQCS commands that were missed while the DRAM rank was in the self-refresh mode.

Other objects and advantages associated with the aspects and embodiments disclosed herein will be apparent to those skilled in the art based on the accompanying drawings and detailed description.

BRIEF DESCRIPTION OF THE DRAWINGS

A more complete appreciation of the various aspects and embodiments described herein and many attendant advantages thereof will be readily obtained as the same becomes better understood by reference to the following detailed description when considered in connection with the accompanying drawings which are presented solely for illustration and not limitation, and in which.

DETAILED DESCRIPTION

Various aspects and embodiments are disclosed in the following description and related drawings to show specific examples relating to exemplary aspects and embodiments. Alternate aspects and embodiments will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and embodiments disclosed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage, or mode of operation.

The terminology used herein describes particular embodiments only and should not be construed to limit any embodiments disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequence of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to" and/or other structural components configured to perform the described action.

According to various aspects, as will be described in further detail herein, a memory controller may implement a periodic ZQ calibration scheme with traffic-based self-refresh, wherein the memory controller may schedule a ZQ short command at each ZQ interval and determine whether a dynamic random-access memory (DRAM) rank in a multi-rank double data rate (DDR) memory system is in a self-refresh mode at each scheduled ZQ interval. In various embodiments, in response to the memory controller that the DRAM rank is not in the self-refresh mode at the ZQ interval, the memory controller may simply execute the scheduled ZQ short command in the normal manner. However, in response to determining that the DRAM rank is in the self-refresh mode at the ZQ interval, the memory controller may record that the DRAM rank missed the scheduled ZQ command rather than exiting the self-refresh mode to issue the ZQ command. The DRAM rank may eventually exit the self-refresh mode and the memory controller may then take appropriate action depending on a number and a type associated with the ZQ calibration commands that were missed while the DRAM rank was in the self-refresh mode. For example, according to various aspects, the memory controller may attempt to schedule a ZQ long command at the next scheduled ZQ interval once the missed ZQ short commands reaches a first threshold, as the ZQ long calibration can compensate more voltage and temperature drift than the ZQ short command. Furthermore, in the event that the ZQ long command is run at the next scheduled ZQ interval because the DRAM rank exited the self-refresh mode, the ZQ calibration behavior may then return to normal (e.g., the ZQ short command may be scheduled at the next ZQ interval). Alternatively, in response to the DRAM rank staying in the self-refresh mode and until missed ZQ long commands reaches a second threshold, the memory controller may force a ZQ long command once the DRAM exits the self-refresh mode and skip the next scheduled ZQ calibration. As such, the forced ZQ long command may guarantee that voltage and temperature variations are compensated even if a DRAM rank spends substantial time in the self-refresh mode.

Accordingly, the periodic ZQ calibration scheme described herein may track the number and the types associated with ZQ calibration commands that are missed while a DRAM rank is in the self-refresh mode to avoid issuing unnecessary ZQ calibration commands while the DRAM is in self-refresh mode. Furthermore, the scheduled ZQ command performed once a DRAM rank exits the self-refresh mode may have a type (e.g., short or long) that can be dynamically changed depending on how many ZQ calibration commands and which ZQ calibration commands are missed while the DRAM rank was in the self-refresh mode. Accordingly, periodic ZQ commands may not affect whether a DRAM rank enters and/or exits the self-refresh mode, thereby simplifying the manner in which system-level sequences are implemented. Further still, each DRAM rank may independently handle ZQ commands, although the memory controller may issue a single ZQ calibration command to multiple ranks in parallel where the multiple ranks exit the self-refresh mode at the same or similar times.

Figure 1:
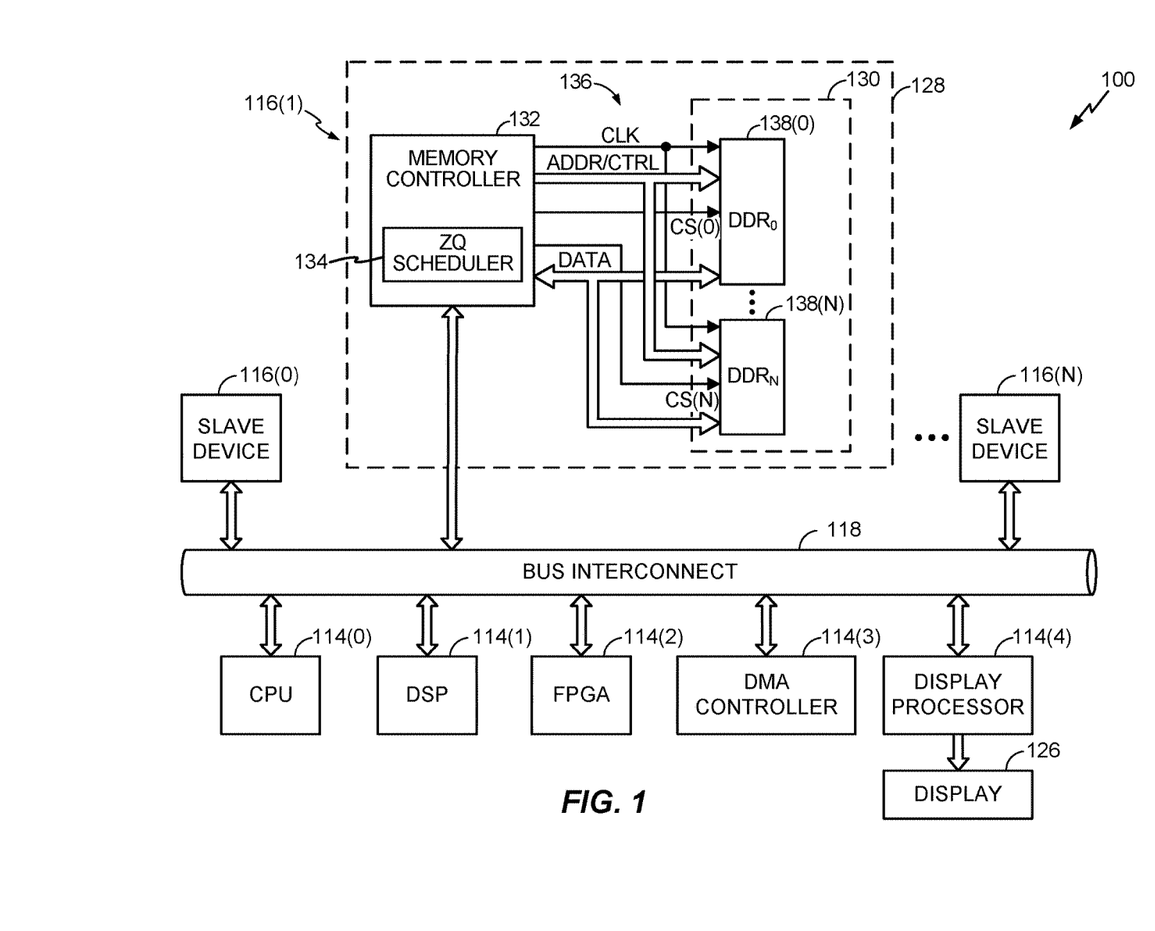
FIG. 1 illustrates an example system that includes at least a multi-rank memory and a memory controller configured to schedule periodic commands to calibrate the various ranks in the multi-rank memory according to a traffic-based self-refresh state associated with each individual rank, according to various aspects.

According to various aspects, FIG. 1 illustrates an example system 100 that includes at least a multi-rank memory 130 and a memory controller 132, wherein the memory controller 132 may include a ZQ scheduler 134 configured to schedule periodic commands to calibrate the various ranks in the multi-rank memory 130 according to a traffic-based self-refresh state associated with each individual rank. In various embodiments, the memory controller 132 and the ZQ scheduler 134 may be provided in a semiconductor die, a system-on-a-chip (SOC) integrated circuit design, and/or other suitable configurations. Before discussing specific examples with respect to how the memory controller 132 and the ZQ scheduler 134 associated therewith may schedule the periodic commands to calibrate the various ranks in the multi-rank memory 130, a basic overview about the example system 100 shown in FIG. 1 will be provided first.

According to various aspects, as shown in FIG. 1, the system 100 includes various master devices 114 interconnected to one or more slave devices 116(0)-116(N) via a bus interconnect 118. The bus interconnect 118 may be configured to allow the master devices 114 that are connected to the bus interconnect 118 to communicate with any slave device(s) 116, which may further be connected to the bus interconnect 118. In various embodiments, the bus interconnect 118 may include an arbiter (not explicitly shown) to arbitrate communication requests from the master devices 114 to the slave devices 116, as the slave devices 116 are shared resources to the master devices 114.

In various embodiments, the master devices 114 and the slave devices 116 can be any suitable electronic device or components. For example, in the example system 100 shown in FIG. 1, the master devices 114 may a central processing unit (CPU) 114(0), a digital signal processor (DSP) 114(1), a field-programmable gate array (FPGA) 114(2), a direct memory access (DMA) controller 114(3), and a display processor 114(4) that controls information provided to a display 126. However, those skilled in the art will appreciate that the master devices 114 may include additional and/or other suitable electronic devices and/or components without limitation to the specific examples shown in FIG. 1 and described herein. Furthermore, in the example implementation shown in FIG. 1, the memory controller 132 and the multi-rank memory 130 may be provided in a memory system 128, which may also be a slave device 116(1) representing a resource shared among the master devices 114. The memory system 128 may be connected to the bus interconnect 118 to allow any master device 114 to provide memory access requests to read from and write to the multi-rank memory 130 in the memory system 128 and to receive read and write responses. To that end, the memory controller 132 may provide an interface between the bus interconnect 118 and the multi-rank memory 130 and control a data flow to and from the multi-rank memory 130 in response to the memory access requests received from the master devices 114.

In various embodiments, memory access information may be provided to the memory controller 132 in a control block to request a memory access transaction to the multi-rank memory 130. The memory controller 132 may include buffer the memory access requests from the master devices 114 within a memory access request queue and control operations to receive and execute memory access requests. For example, in various embodiments, a memory bus 136 may provide an interface between the multi-rank memory 130 and the memory controller 132, wherein the memory bus 136 may include chip selects CS(0)-CS(N), which may respectively correspond to each memory unit 138(0)-138(N) provided in the multi-rank memory 130, wherein each memory unit 138(0)-138(N) may be a separate memory chip. The memory controller 132 may selectively enable the chip selects CS(0)-CS(N) to enable the memory units 138(0)-138(N) that contain the desired memory location to be accessed. The memory controller 132 may enable one memory unit 138 at a time in the example described herein such that one memory unit 138 asserts data on a data bus (DATA) at one time to avoid data collisions. The memory bus 136 may further include an address/control bus (ADDR/CTRL) that allows the memory controller 132 to control the memory address accessed in the memory units 138(0)-138(N) to either write to or read from the multi-rank memory 130 and a clock signal (CLK) to synchronize timing between the memory controller 132 and the memory units 138(0)-138(N).

Figure 2:
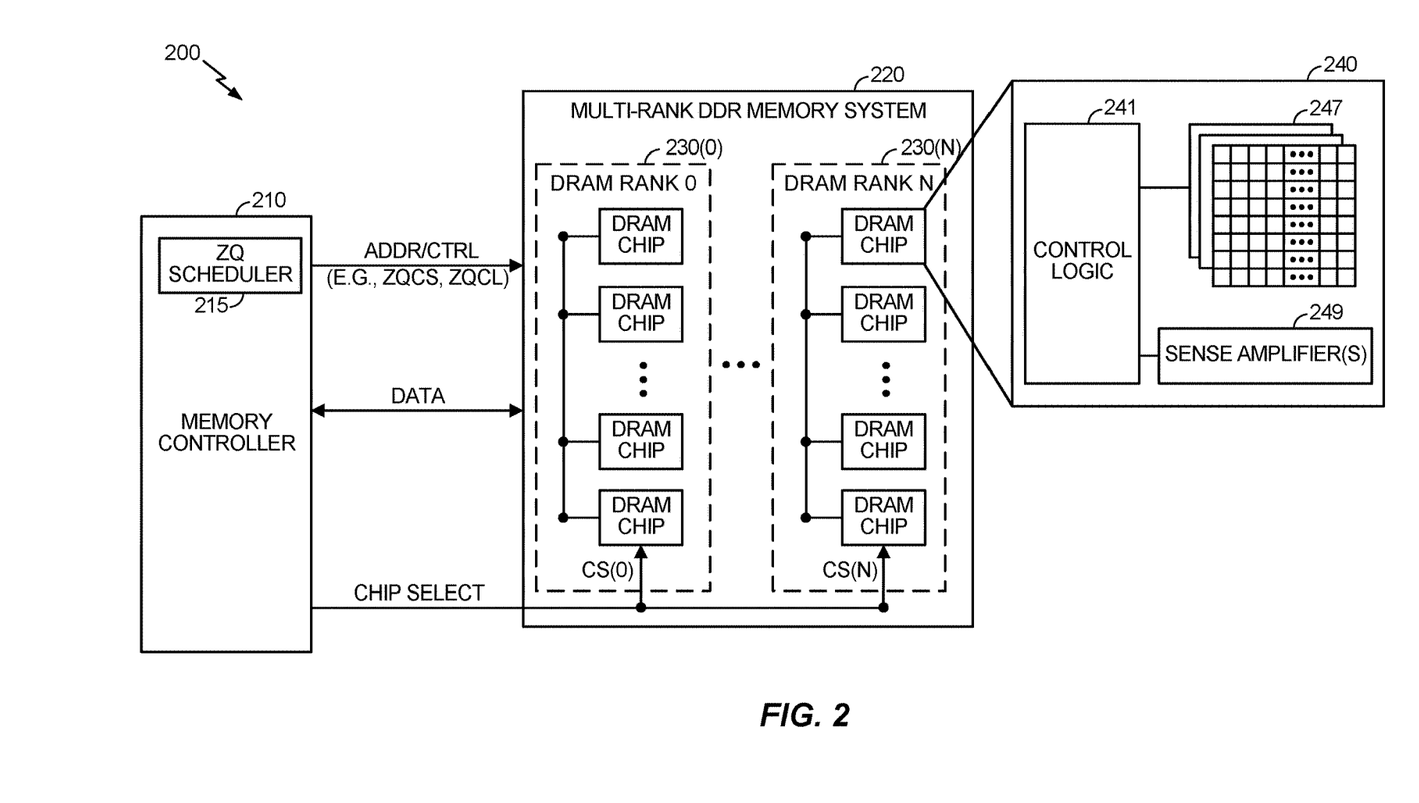
FIG. 2 illustrates the memory controller and the multi-rank memory system shown in FIG. 1 in more detail, according to various aspects.

According to various aspects, FIG. 2 illustrates an example memory system 200 that may include at least a memory controller 210 and a multi-rank memory system 220, which may generally be configured in a similar manner to the memory controller 132 and the multi-rank memory 130 shown in FIG. 1. As shown in FIG. 2, the multi-rank memory system 220 may include multiple memory units 230(0)-230(N). According to the various aspects and embodiments described herein, the multi-rank memory system 220 may be a double data rate (DDR) memory system and the memory units 230(0)-230(N) may be dynamic memories, and specifically dynamic random-access memory (DRAM) ranks that each have multiple DRAM chips 240 located thereon. As such, the multi-rank memory system 220 may be referred to herein as multi-rank DDR memory system 220 and the memory units 230(0)-230(N) may be referred to herein as DRAM ranks 230(0)-230(N), whereby the memory controller 210 that controls accesses to the memory units 230(0)-230(N) may be a DDR memory controller. The various aspects and embodiments described herein may therefore be applicable to various suitable DDR dynamic memory technologies, wherein examples may include, without limitation, synchronous DRAM (SDRAM), DDR SDRAM, DDR2 DRAM, DDR3 DRAM, mobile DDR (MDDR) DRAM, low power DDR (LPDDR) DRAM, LPDDR2 DRAM, etc. Furthermore, in various embodiments, the memory controller 210 or the multi-rank DDR memory system 220 may be a separate device provided on a motherboard or other printed circuit board (PCB) or alternatively integrated into one semiconductor die or the same semiconductor die as a processor or other suitable device.

According to various aspects, as mentioned above, each DRAM rank 230 may include multiple DRAM chips 240, wherein FIG. 2 shows an example architecture associated with one DRAM chip 240 within DRAM rank 230(N). As shown therein, the DRAM chip 240 may include several banks 247, referred to individually as a bank 247, wherein each memory bank 247 may be organized according to a rectangular array in a grid-like pattern, with "rows" and "columns" coupled to one another through wordlines and bitlines. As such, to access a memory location in the multi-rank DDR memory system 220, the memory controller 210 may assert a chip select CS(0)-CS(N) and issue a memory page open command that activates a certain row according to the address indicated on the ADDR/CTRL bus. After control logic 241 has opened the desired row, the memory controller 210 may issue a column address along with either a "read" or "write" command to read data from or write data to the desired memory location. To request access to another row in the same bank 247 or another bank 247, the memory controller 210 deactivates or closes the active row. In general, each row-column combination may be a DRAM cell, which generally includes a capacitor-transistor pair, while each bank 247 may include dedicated sense amplifiers 249 to enable multiple banks 247 to process memory requests in parallel provided that timing restrictions are implemented to avoid contentions on common internal and external buses. Because the read process in DRAM is generally destructive, in that the charge on DRAM cells is removed in an entire row, the sense amplifiers 249 are generally used to temporarily hold and latch the data and then to rewrite the data in the accessed row before outputting the data. The electronics on the DRAM chip 240 may therefore refresh an entire memory row in parallel during normal read or write cycles. However, because normal memory accesses cannot be guaranteed to access each row, separate refresh processes may be used to refresh each DRAM cell before the electric charge on the capacitor discharges to the point that the data is lost.

Among the possible refresh processes that can be implemented in the multi-rank DDR memory system 220, a self-refresh mode generally consumes the least power. In that regard, the self-refresh mode is to be distinguished from an auto-refresh mode, wherein the latter involves pre-charging all open rows before the memory controller 210 asserts row access strobe (RAS) and column access strobe (CAS) signals along with the chip select corresponding to the DRAM chip 240 to be auto-refreshed. However, the auto-refresh process may consume substantial power because all clocked circuitry remains active during the entire auto-refresh period. Accordingly, each DRAM rank 230 may independently enter and exit the "self-refresh" mode when there is no memory traffic. In the self-refresh mode, all external input/output (I/O) pins and clocks may be disabled and the DRAM rank 230 may preserve any data stored in the DRAM chips 240 without intervention from the memory controller 210. The self-refresh mode may cause issues, however, due to the importance to periodically calibrate the DRAM ranks 230 to compensate voltage and temperature variations.

For example, the memory controller 210 may periodically initiate the calibration, commonly referred to as ZQ calibration. However, any DRAM ranks 230 that are in the self-refresh mode cannot serve the ZQ calibration commands issued from the memory controller 210 (e.g., because the external I/O pins and clocks connecting the DRAM ranks 230 to the memory controller 210 are disabled in the self-refresh mode). Accordingly, there may be tradeoffs with respect to the interactions between the self-refresh mode and the need to perform ZQ calibration. In particular, although memory power may be saved when a DRAM rank 230 enter the self-refresh mode (e.g., because there is no current memory traffic to the DRAM rank 230), the DRAM rank 230 cannot serve the ZQ calibration commands while in the self-refresh mode such that voltage and temperature variations may accumulate while the DRAM rank 230 stays in the self-refresh mode. As such, when the DRAM rank 230 spends substantial time in the self-refresh mode, memory access timing may deteriorate to a point where a ZQ calibration may be necessary before any traffic can resume. However, avoiding unnecessary (or excessive) ZQ calibration may be desired because ZQ calibration stalls the entire memory channel, blocking traffic to all DRAM ranks 230(0)-230(N) until the ZQ calibration has completed. Accordingly, the more DRAM ranks 230(0)-230(N) that are present in the multi-rank DDR memory system 220, the performance impact that ZQ calibration will contribute increases and the complexity to handle the need to perform periodic ZQ calibration will likewise increase.

According to various aspects, there are generally two ZQ calibration command types that the memory controller 210 may issue to calibrate the DRAM ranks 230(0)-230(N) in the multi-rank DDR memory system 220. More particularly, the memory controller 210 may issue a ZQ calibration "long" (ZQCL) command, which is typically used during power-up initialization and/or reset conditions. In addition, the memory controller 210 may issue a ZQ calibration "short" (ZQCS) command, which tends to be used to track and periodically compensate minor variations in voltage and temperature during normal operation. As such, the ZQCS command can generally be completed faster than the ZQCL command, although the ZQCL command can compensate larger voltage and temperature deviations than the ZQCS command relative to the last time that ZQ calibration (short or long) was performed. For example, the ZQCL command typically completes in five hundred twelve (512) DRAM clock cycles, whereas the ZQCS command typically completes in one hundred twenty-eight (128) DRAM clock cycles. In that context, those skilled in the art will appreciate that the total system clock cycles needed to complete the ZQCS/ZQCL commands may be divided in half in the multi-rank DDR memory system 220, which operates on both rising and falling edges in any given clock cycle. Furthermore, those skilled in the art will appreciate that in certain implementations, the above-mentioned timing window to complete the ZQCL command generally refers to ZQCL commands issued subsequent to a ZQCL command that was performed at power-up initialization or during a reset condition, as the initialization/resent ZQCL command typically takes five hundred twelve (512) system clock cycles (i.e., one thousand twenty-eight (1028) DRAM clock cycles).

Figure 3A:
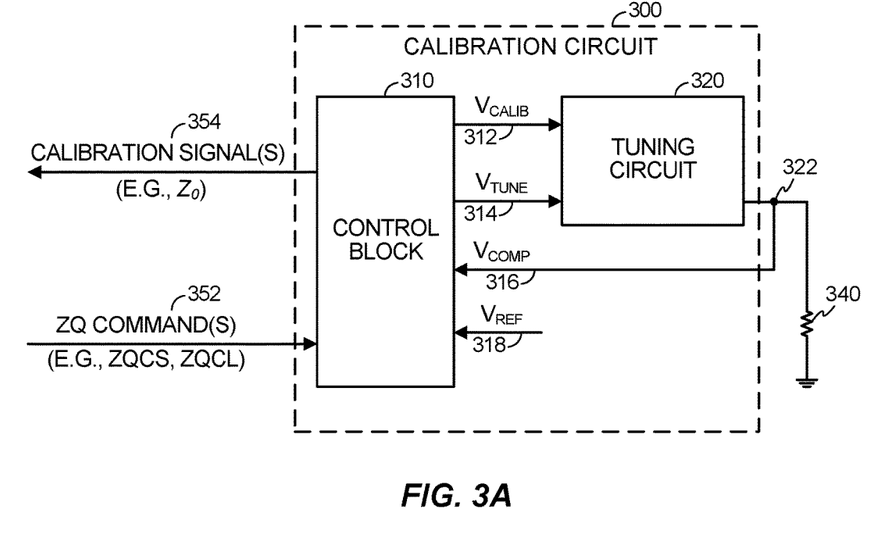
FIG. 3A illustrates an example circuit configured to calibrate a multi-rank memory based on commands from a memory controller, according to various aspects.
Figure 3B:
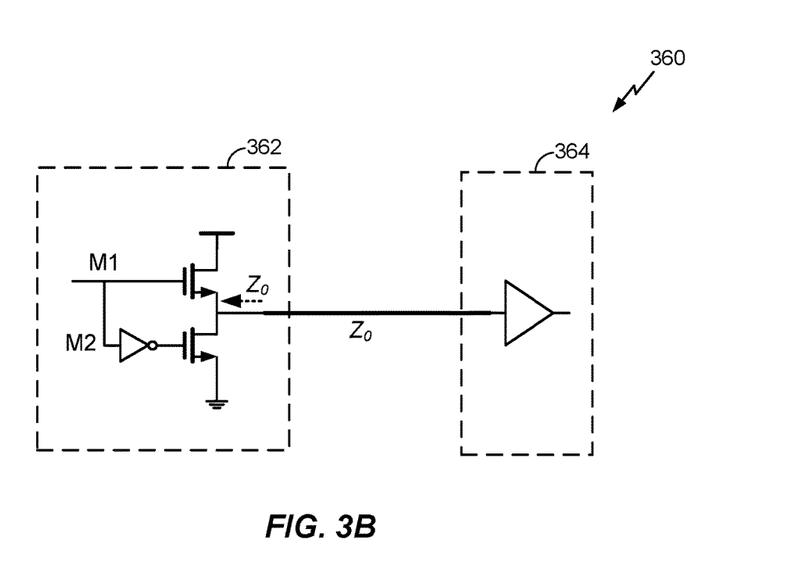
FIG. 3B illustrates an example circuit that can be configured with a calibrated turn-on impedance, according to various aspects.

According to various aspects, FIG. 3A and FIG. 3B illustrate example circuitry that can be used to carry out a ZQ calibration (long or short). However, those skilled in the art will appreciate that the circuitry shown in FIG. 3A and FIG. 3B is exemplary only, as other suitable circuits and/or methodologies to carry out the ZQ calibration may be suitably employed. As such, the description provided herein with respect to FIG. 3A and FIG. 3B is intended to be illustrative to describe general principles with respect to how the ZQ calibration can be used to tune certain operational parameters in a multi-rank DDR memory system, such as the multi-rank DDR memory system 220 shown in FIG. 2 and not to limit any aspect or embodiment described herein.

According to various aspects, referring to FIG. 3A, an example calibration circuit 300 as illustrated therein may be configured to calibrate a multi-rank memory based on commands from a memory controller. As such, in various embodiments, the calibration circuit 300 shown in FIG. 3A may be configured to receive one or more ZQ calibration commands 352 from a memory controller, such as the memory controller 210 shown in FIG. 2, and to derive one or more calibration signals 354 that can be used to tune operational parameters in a multi-rank memory system, such as the multi-rank DDR memory system 220 shown in FIG. 2. For example, in various embodiments, the memory controller 210 may include a ZQ scheduler 215 to periodically issue the ZQ calibration commands 352 to the calibration circuit 300 at various times to adjust a "turn-on" impedance associated with one or more output drivers in the multi-rank DDR memory system 220 and thereby calibrate a drive strength associated with the various DRAM ranks 230. In addition, the calibration circuit 300 may derive the one or more calibration signals 354 to adjust on-die termination (ODT) impedances the multi-rank DDR memory system 220. For example, the calibration circuit 300 may comprise a control block 310 and a tuning circuit 320 that can derive the one or more calibration signals 354 to reflect a system voltage and temperature at a certain time and execute the ZQ calibration commands 352 periodically issued from the ZQ scheduler 215 to adjust the one or more calibration signals 354 and thereby compensate variations in the system voltage and temperature, which may drift up and down over time.

According to various aspects, as shown in FIG. 3, the calibration circuit 300 may be coupled to a precise external resistor 340 (sometimes called a "ZQ resistor") having a known impedance, which may be programmed in the control block 310. The calibration circuit 300 and the precise external resistor 340 may be disposed in a dedicated ZQ calibration path between each DRAM rank 230 in the multi-rank DDR memory system 220 and an external node (e.g., a ground node or a positive voltage value). For example, in various embodiments, the calibration circuit 300 may connect to a dedicated ZQ pin located on a semiconductor die or chip (not explicitly shown in FIG. 3), wherein the dedicated ZQ pin is sometimes called a "ZQ ball" in reference to ball grid array (BGA) packaging that may be used in a DRAM package. In various embodiments, the precise external resistor 340 may be shared among different devices (e.g., where any timing associated with the ZQ calibration does not overlap).

In various embodiments, the control block 310 may be configured to execute the periodic ZQ commands 352 and to derive the calibration signals 354. For example, the control block 310 may include one or more circuits that are substantially matched to the DRAM output drivers and ODT and the tuning circuit 320 may include one or more devices arranged to have an impedance that approximates an impedance associated with the precise external resistor 340 (e.g., the devices in the tuning circuit 320 may be arranged to form a polyresistor, a resistor network, etc.). Accordingly, when a ZQ command 352 is received at the control block 310, a line 312 between the control block 310 and an input to the tuning circuit 320 may be driven to a calibration voltage ($V_{CALIB}$) and a feedback line 316 coupled between the control block 310 and an output from the tuning circuit 320 may carry a comparison voltage ($V_{COMP}$). The control block 310 may then compare a reference voltage ($V_{REF}$) to the comparison voltage $V_{COMP}$ on the feedback line 316 to determine an output voltage at a point 322 between the tuning circuit 320 and the precise external resistor 340, wherein the reference voltage $V_{REF}$ may be generated internally at the control block 310 or provided to the control block 310 on an input line 318 as shown in FIG. 3A. In general, the reference voltage $V_{REF}$ may have a value that depends on the calibration voltage $V_{CALIB}$. For example, in an implementation where the devices that form the tuning circuit 320 have an impedance that approximates the precise external resistor 340, a value associated with the reference voltage $V_{REF}$ may be half the calibration voltage $V_{CALIB}$ such that the output voltage at point 322 should be half the calibration voltage $V_{CALIB}$ when the impedance at the tuning circuit 320 and the precise external resistor 340 match. Accordingly, the control block 310 may provide a tuning voltage ($V_{TUNE}$) to the tuning circuit 320 on a line 314 until the comparison voltage $V_{COMP}$ that corresponds to the output voltage at point 322 equals the reference voltage $V_{REF}$. The value at which the tuning voltage $V_{TUNE}$ resulted in the comparison voltage $V_{COMP}$ equaling the reference voltage $V_{REF}$ may then be stored in the control block 310 and used to derive the calibration signals 354 used to tune the output driver and ODT impedances.

For example, as shown in FIG. 3A, one calibration signal 354 output from the control block 310 may be a "turn-on" impedance $Z_0$. As such, FIG. 3B illustrates an example circuit 360 that can be configured with the calibrated turn-on impedance $Z_0$, wherein the circuit 360 shown in FIG. 3B may comprise an example output driver 362 and ODT 364. As shown in FIG. 3B, the output driver may include a transistor pair, wherein the transistor pair may include a first transistor coupled to a first signal M1 and a second transistor coupled to a second signal M2. In the example circuit 360 shown in FIG. 3B, an inverter is disposed in a path between the first signal M1 and the second signal M2, whereby the first signal M1 may generally be inverted to derive the second signal M2. As such, with reference to FIG. 3B, the calibration signals 354 derived at the calibration circuit 300 may be used to calibrate the output driver 362 and ODT 364 such that M1 and M2 have a turn-on impedance at $Z_0$, which may have a calibrated value that compensates any variations in system voltage and temperature and thereby improve signal timing accuracy throughout memory operations.

According to various aspects, referring again to FIG. 2, the ZQ scheduler 215 at the memory controller 210 may be configured with appropriate logic (e.g., hardware, software, and/or a combination thereof) to schedule ZQ calibration commands in the multi-rank DDR memory system 220. For example, as mentioned above, the ZQ scheduler 215 may generally issue a ZQ long (or ZQCL) command when the multi-rank DDR memory system 220 (or one or more DRAM ranks 230) initially powers up or is in a reset condition. The ZQCL command performed at initialization/reset may therefore resolve differences in manufacturing process variations or other differences between particular DRAM implementations, calibrating the various DRAM ranks 230 to an initial voltage and temperature setting. Thereafter, the ZQ scheduler 215 may periodically issue the ZQ short (or ZQCS) command to compensate changes in the voltage and temperature that occur over time during normal operations, which may help to maintain linear output driver and ODT impedances over the full voltage and temperature range. Furthermore, subsequent to the ZQCL command performed at initialization/reset, the ZQ scheduler 215 may also issue a ZQCL command (e.g., during idle periods when there is no traffic to one or more DRAM ranks 230 in order to compensate voltage and temperature drifts that accumulate a larger impedance error than be corrected with a ZQCS command). However, as mentioned above, ZQ calibration stalls the entire memory channel and blocks traffic to all DRAM ranks 230, whereby the ZQ scheduler 215 may issue ZQ calibration commands only when necessary. One situation in which ZQ calibration may be unnecessary is when a particular DRAM rank 230 enters self-refresh mode because there is no traffic to that DRAM rank 230, although memory access timing may deteriorate to a point that ZQ calibration becomes necessary before traffic can resume in the event that the DRAM rank 230 spends substantial time in the self-refresh mode. Accordingly, because the self-refresh mode offers significant memory power savings, the ZQ scheduler 215 may be configured to schedule the ZQ commands in a manner that balances power consumption and performance in the multi-rank DDR memory system 220.

Figure 4:
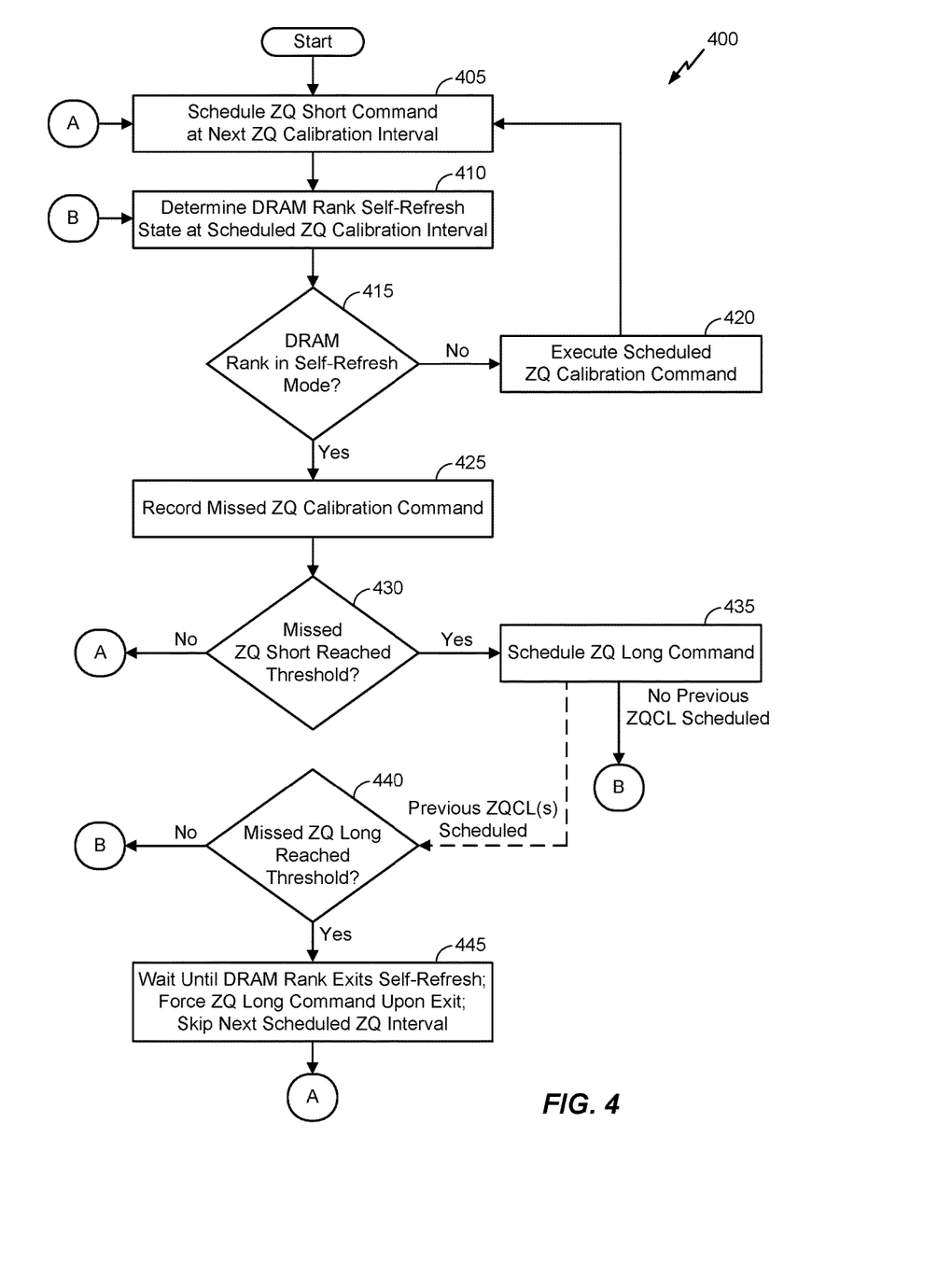
FIG. 4 illustrates an example method that a memory controller may implement to schedule periodic commands to calibrate various ranks in a multi-rank memory according to a traffic-based self-refresh state, according to various aspects.

In particular, according to various aspects, FIG. 4 illustrates an example methodology 400 that may be implemented at a memory controller to schedule periodic ZQ commands to calibrate a DDR memory system with multiple DRAM ranks that may independently enter and exit a traffic-based self-refresh mode. As such, in various embodiments, the methodology 400 shown in FIG. 4 may be implemented at the memory controller 210 shown in FIG. 2 to schedule periodic ZQ commands to calibrate the multi-rank memory system 220 shown in FIG. 2. However, those skilled in the art will appreciate that the methodology 400 shown in FIG. 4 may be implemented in any suitable memory system that includes multiple DRAM ranks without limitation to the particular implementation shown in FIG. 2 or otherwise described herein.

In various embodiments, the methodology 400 may start at block 405 after any initial ZQ long (or ZQCL) command has been completed to calibrate each DRAM rank to an initial voltage and temperature setting in the multi-rank DDR memory system. Accordingly, at block 405, the memory controller may schedule a ZQ short (or ZQCS) command at a next ZQ calibration interval. In various embodiments, the ZQ calibration interval (e.g., a time between ZQ calibration commands or a frequency at which the ZQ calibration commands are issued) may depend on a rate at which voltage and temperature drifts in the multi-rank DDR memory system. As such, one example method to determine the ZQ calibration interval may depend on the voltage drift rate ($V_{DRIFT}$), a maximum voltage sensitivity ($V_{SENS}$), the temperature drift rate ($T_{DRIFT}$), a maximum temperature sensitivity ($T_{SENS}$), and a percentage value that represents a largest impedance error that can be corrected in a ZQCS period ($ZQ_{CORRECTION}$). Based on the above-mentioned values, the ZQ interval may then be calculated as follows:

$$\frac{ZQ_{CORRECTION}}{(V_{SENS} \times V_{DRIFT}) + (T_{SENS} \times T_{DRIFT})} = ZQ_{INTERVAL}$$

For example, assuming that the voltage drift rate ($V_{DRIFT}$) is 15 millivolts (mV) per second, the maximum voltage sensitivity ($V_{SENS}$) is 0.20% per millivolt, the temperature drift rate ($T_{DRIFT}$) is 1 degree Celsius per second, the maximum temperature sensitivity ($T_{SENS}$) is 0.75% per degree Celsius, and the largest impedance error that can be corrected in a ZQCS period is 1.5%, then the ZQ interval may be 0.4 seconds. Those skilled in the art will appreciate that the above method to calculate the ZQ interval and the values given above are illustrative only and that other suitable methods may be used.

Figure 5:
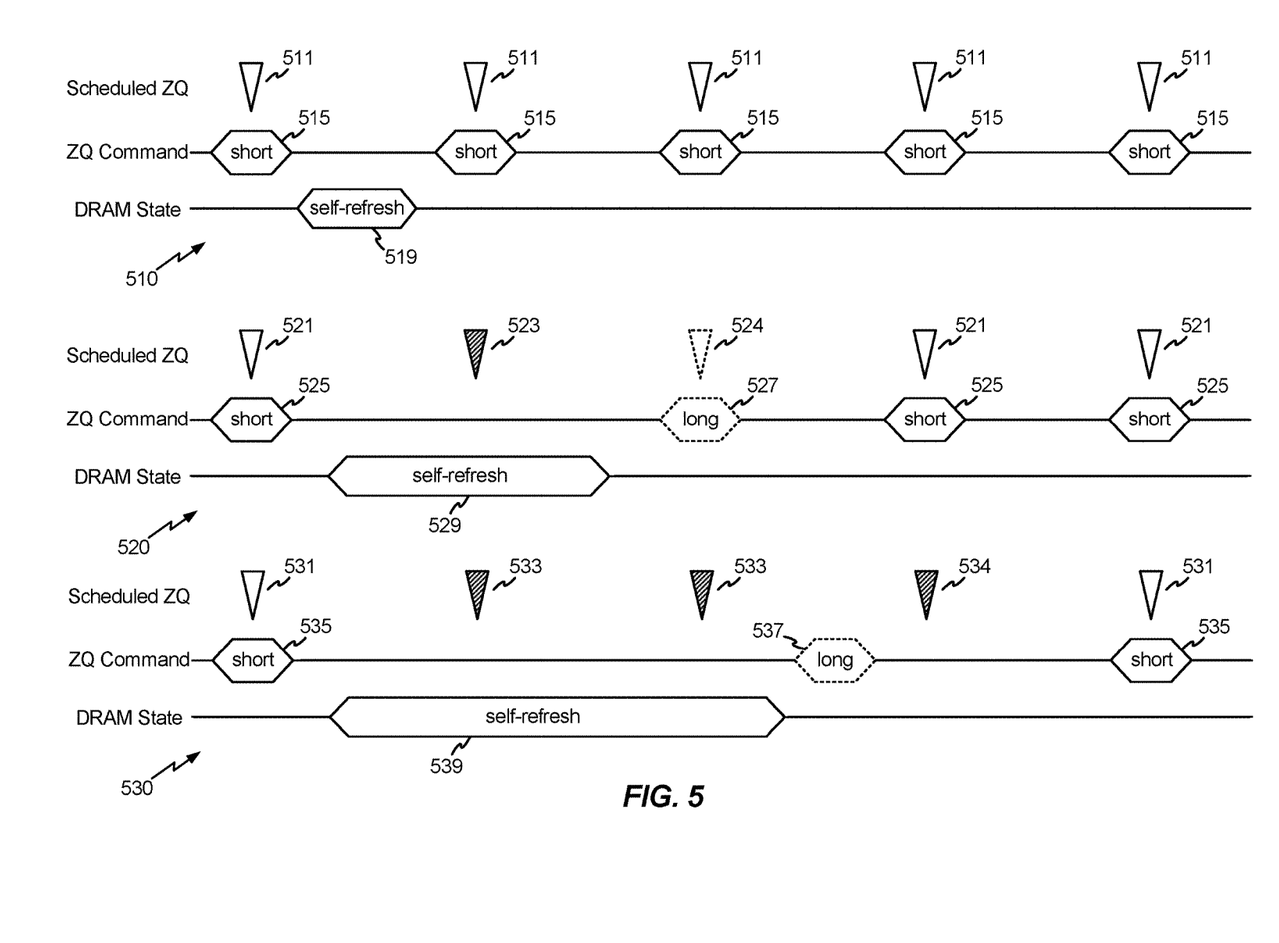
FIG. 5 illustrates example timing diagrams that represent particular use cases in which periodic commands to calibrate one or more ranks in a multi-rank memory are scheduled according to a traffic-based self-refresh state, according to various aspects.

In various embodiments, at block 410, the memory controller may determine a self-refresh state associated with each DRAM rank at the next scheduled ZQ interval. As such, in response to determining at block 415 that a DRAM rank is not in the self-refresh mode, the scheduled ZQCS command may be executed at block 420 in the normal manner and the methodology 400 may then return to block 405 where another ZQCS command is scheduled at the next ZQ interval. For example, according to various aspects, FIG. 5 illustrates example timing diagrams that represent particular use cases that may follow from the methodology 400 shown in FIG. 4. Among the various timing diagrams shown therein, a timing diagram 510 illustrates the above-mentioned example whereby a periodic ZQCS command may be executed as scheduled at block 420 to calibrate a DRAM rank that is not in the self-refresh mode at the scheduled ZQ interval. More particularly, in the timing diagram 510, a ZQCS command 515 is scheduled at each periodic ZQ interval 511. Although the DRAM rank is in the self-refresh mode between the first and second ZQ intervals 511, as depicted at 519, the DRAM rank enters the self-refresh mode after the first ZQ interval 511 and exits the self-refresh mode prior to the second ZQ interval 511. As such, the ZQCS commands 515 may simply be executed at the scheduled ZQ intervals 511 because the DRAM rank is not in the self-refresh mode during any scheduled ZQ interval 511.

However, referring again to FIG. 4, the memory controller may deviate from the normal ZQ behavior in response to determining at block 415 that one or more DRAM ranks are in the self-refresh mode at the scheduled ZQ interval. More particularly, rather than causing the DRAM rank(s) to exit the self-refresh mode in order to execute the scheduled ZQCS command, the memory controller may record that the scheduled ZQCS command was missed at block 425. For example, at block 425, the memory controller may increment a counter that tracks how many ZQCS commands the DRAM rank(s) missed while in the self-refresh mode. In various embodiments, the memory controller may then determine whether the missed ZQCS commands have reached a first threshold at block 430, wherein the first threshold may generally be a non-zero integer value. In response to determining that the missed ZQCS commands have not reached the first threshold, the methodology 400 may likewise return to block 405 where another ZQCS command is scheduled at the next ZQ interval. In this case, however, the missed ZQCS commands may accumulate in the event that the DRAM rank(s) stay in the self-refresh mode past one or more subsequent ZQ intervals as determined at blocks 410 and 415. Returning to block 430, in response to the missed ZQCS commands reaching the first threshold, the memory controller may then schedule a ZQ long (ZQCL) command at the next ZQ interval at block 435, as the ZQCL command may compensate wider drifts in voltage and temperature than can be compensated in a ZQCS period. Assuming that no previous ZQCL command was scheduled, the methodology 400 may then return to block 410 where the memory controller may again determine the self-refresh state associated with the DRAM rank at the next scheduled ZQ interval. As such, in the event that the DRAM rank(s) exited the self-refresh mode before the next scheduled ZQ interval, the scheduled ZQCL command may be executed at block 420 and the methodology 400 may return to block 405 where normal ZQ behavior may resume (i.e., a ZQCS command is scheduled at the next ZQ interval and any missed ZQ calibrations are reset to zero).

Referring again to FIG. 5, timing diagram 520 is shown therein to illustrate the above-mentioned example whereby a ZQCL command is scheduled and executed when a DRAM rank misses one or more scheduled ZQCS commands, wherein the timing diagram 520 may assume that the first threshold mentioned above is set to one (1). As shown in the timing diagram 520, a ZQCS command 525 is scheduled at a first periodic ZQ interval 521 and executed in the normal manner because the DRAM rank is not in the self-refresh mode at that time. However, as depicted at 529, the DRAM rank enters the self-refresh mode after the first scheduled ZQ interval 521 and is still in the self-refresh mode at the next ZQ interval 523. As such, a ZQCL command 527 is scheduled at the next ZQ interval 524 and the scheduled ZQCL command 527 is executed because the DRAM rank has exited the self-refresh mode before the ZQ interval 524 in which the ZQCL command 527 is scheduled. As such, normal ZQ behavior then resumes, whereby ZQCS commands 525 are scheduled in subsequent ZQ intervals 521 and executed as scheduled because the DRAM rank is not in the self-refresh mode.

Now referring again to FIG. 4, the memory controller may take different action subsequent to block 435 where one or more previous ZQCL commands were scheduled. In particular, where a previous ZQCL command was scheduled because the missed ZQCS commands reached the first threshold, the memory controller may make a further determination at block 440 in the event that the ZQ calibration missed at block 425 was a ZQCL command In such a case, at block 440, the memory controller may determine whether the missed ZQCL commands have reached a second threshold, wherein the second threshold may likewise be a non-zero integer value. In response to determining that the missed ZQCL commands have not reached the second threshold, the methodology 400 may likewise return to block 410 where another ZQCL command may be attempted at the next scheduled ZQ interval. Alternatively, at block 445, the memory controller may wait until the DRAM rank exits the self-refresh mode and then trigger a ZQCL command once the DRAM rank exits the self-refresh mode, which may generally occur when the second threshold is set to one (1) or missed ZQCL commands otherwise accumulate to a point that reaches the second threshold. In this manner, any voltage and temperature drift that accumulated while the DRAM rank was in the self-refresh mode may be compensated as soon as possible after the DRAM rank exits the self-refresh mode. Furthermore, because the ZQCL command may be triggered between regular periodic ZQ intervals, a next scheduled ZQ interval may be skipped before resuming normal ZQ behavior at block 405 in the following ZQ interval.

Referring again now to FIG. 5, another timing diagram 530 is shown therein to illustrate the above-mentioned example in which ZQCL commands that were scheduled following missed ZQCS commands are further missed until the missed ZQCL commands reach the second threshold. For simplicity, the timing diagram 530 assumes that the first threshold and the second threshold mentioned above are both set to one (1). As shown therein, a ZQCS command 535 is scheduled at a first periodic ZQ interval 531 and executed in the normal manner because the DRAM rank is not in the self-refresh mode at that time. However, as depicted at 539, the DRAM rank enters the self-refresh mode after the first scheduled ZQ interval 531 and stays in the self-refresh mode through the second and third ZQ intervals 533. As such, a ZQCL command (not shown) would have been scheduled at the third ZQ interval 533 following the missed ZQCS command at the second ZQ interval 533. Accordingly, because the DRAM rank did not exit the self-refresh mode in time to execute the ZQCL command attempted at the third ZQ interval 533, a ZQCL command 537 is triggered after the DRAM rank exits from the self-refresh mode depicted at 539. The next ZQ interval 534 following the forced ZQCL command 537 is then skipped and normal ZQ behavior then resumes at the last ZQ interval 531 shown in the timing diagram 530, which illustrates that a ZQCS command 535 is scheduled and executed in the last ZQ interval 531 in the normal manner because the DRAM rank is not in the self-refresh mode.

Figure 6:
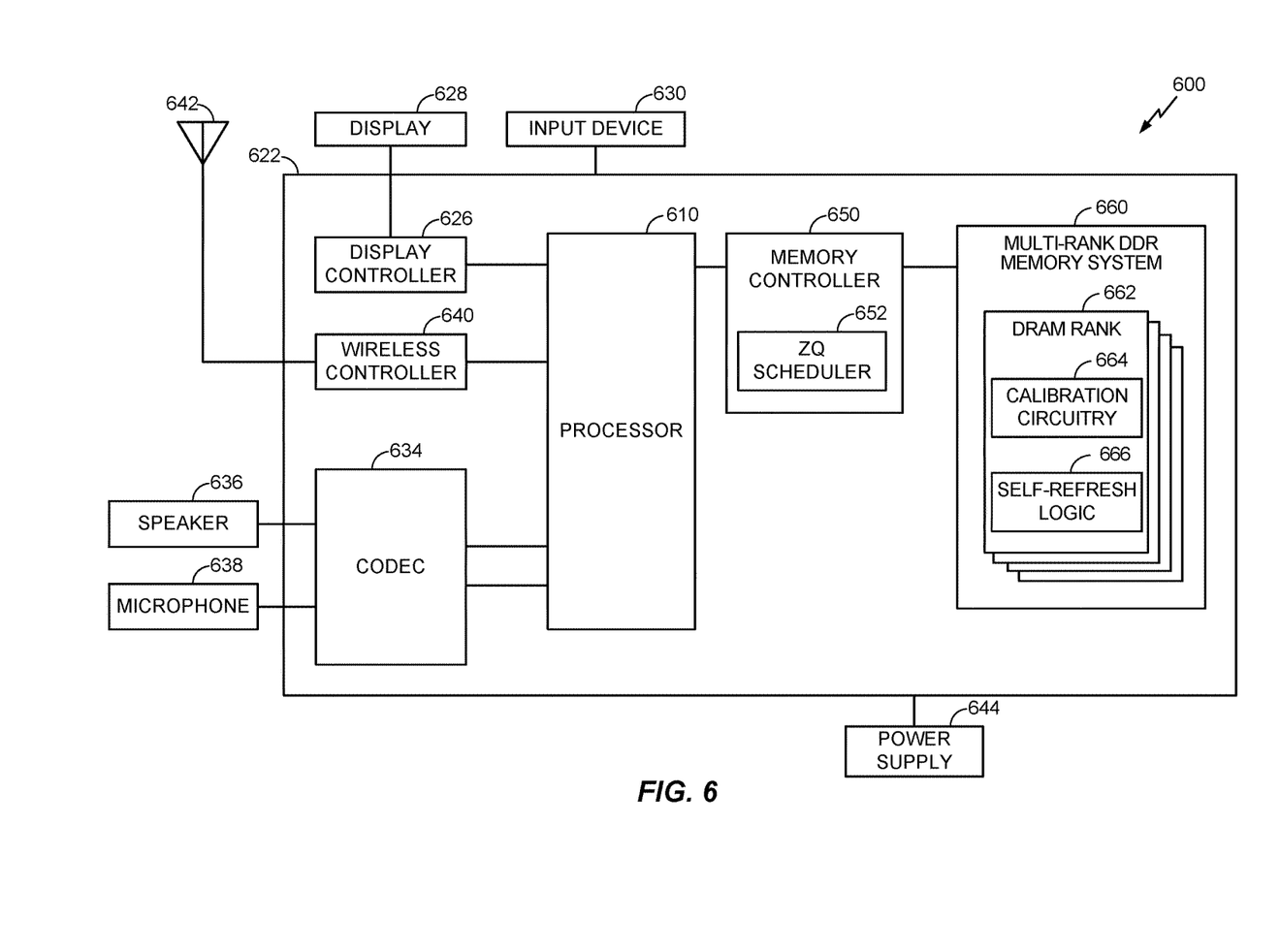
FIG. 6 illustrates an exemplary processing device that may advantageously implement the various aspects described herein.

According to various aspects, FIG. 6 illustrates an exemplary processing device that may advantageously implement the various aspects described herein. In various embodiments aspects, the processing device 600 may be configured as a wireless device. The processing device 600 can include or otherwise implement one or more aspects discussed in further detail above with reference to FIG. 1 through FIG. 5. As shown in FIG. 6, the processing device 600 may include a processor 610, which can be a digital signal processor (DSP) or any general purpose processor or central processing unit (CPU) as known in the art, for example. The processor 610 may be communicatively coupled to a memory 660, which may comprise a multi-rank DDR memory system as described herein. Accordingly, the multi-rank DDR memory system 660 may include multiple DRAM ranks 662 configured with self-refresh logic 666 such that the multiple DRAM ranks 662 may independently enter and exit a self-refresh mode. Furthermore, the DRAM ranks 662 may include calibration circuitry 664 to execute ZQ calibration commands (e.g., ZQ short or ZQ long calibration commands) issued from a memory controller 650. For example, as mentioned above, the memory controller 650 may include a ZQ scheduler 652 that may schedule the ZQ calibration commands according to a traffic-based self-refresh state associated with the individual DRAM ranks 662 in the multi-rank DDR memory system 660.

According to various embodiments, FIG. 6 also shows that the processing device 600 may include a display controller 626 coupled to the processor 610 and to a display 628. The processing device 600 may further include a coder/ decoder (CODEC) 634 (e.g., an audio and/or voice CODEC) coupled to processor 610. Other components, such as a wireless controller 640 (e.g., a modem) are also illustrated in FIG. 6. In various embodiments, a speaker 636 and a microphone 638 can be coupled to the CODEC 634. Furthermore, as shown in FIG. 6, a wireless controller 640 can be coupled to a wireless antenna 642. According to various aspects, the processor 610, the display controller 626, the memory controller 650, the multi-rank DDR memory system 660, the CODEC 634, and/or the wireless controller 640 may be included or otherwise provided in a system-in-package or a system-on-chip device 622.

In various embodiments, an input device 630 and a power supply 644 may be coupled to the system-on-chip device 622. Moreover, as illustrated in FIG. 6, the display 628, the input device 630, the speaker 636, the microphone 638, the wireless antenna 642, and the power supply 644 are external to the system-on-chip device 622. However, those skilled in the art will appreciate that the display 628, the input device 630, the speaker 636, the microphone 638, the wireless antenna 642, and/or the power supply 644 can be coupled to a component associated with the system-on-chip device 622 (e.g., via an interface or a controller). Furthermore, although FIG. 6 depicts the processing device 600 as a wireless communications device, those skilled in the art will appreciate that the processor 610, the memory controller 650, and the multi-rank DDR memory system 660 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Those skilled in the art will appreciate that information and signals may be represented using various different technologies and techniques. For example, data, instructions, commands, information, signals, bits, symbols, and chips that may be referenced throughout the above description may be represented according to voltages, currents, electromagnetic waves, magnetic fields or particles, optical fields or particles, or any suitable combination thereof.

Further, those skilled in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted to depart from the scope of the various aspects and embodiments described herein.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The methods, sequences, and/or algorithms described in connection with the aspects disclosed herein may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of non-transitory computer-readable medium known in the art. An exemplary non-transitory computer-readable medium may be coupled to the processor such that the processor can read information from, and write information to, the non-transitory computer-readable medium. In the alternative, the non-transitory computer-readable medium may be integral to the processor. The processor and the non-transitory computer-readable medium may reside in an ASIC. The ASIC may reside in an IoT device. In the alternative, the processor and the non-transitory computer-readable medium may be discrete components in a user terminal.

In one or more exemplary aspects, the functions described may be implemented in hardware, software, firmware, or any combination thereof. If implemented in software, the functions may be stored on or transmitted over as one or more instructions or code on a non-transitory computer-readable medium. Computer-readable media may include storage media and/or communication media including any non-transitory medium that may facilitate transferring a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, DSL, or wireless technologies such as infrared, radio, and microwave, then the coaxial cable, fiber optic cable, twisted pair, DSL, or wireless technologies such as infrared, radio, and microwave are included in the definition of a medium. The term disk and disc, which may be used interchangeably herein, includes CD, laser disc, optical disc, DVD, floppy disk, and Blu-ray discs, which usually reproduce data magnetically and/or optically with lasers. Combinations of the above should also be included within the scope of computer-readable media.

While the foregoing disclosure shows illustrative aspects and embodiments, those skilled in the art will appreciate that various changes and modifications could be made herein without departing from the scope of the disclosure as defined by the appended claims. Furthermore, in accordance with the various illustrative aspects and embodiments described herein, those skilled in the art will appreciate that the functions, steps, and/or actions in any methods described above and/or recited in any method claims appended hereto need not be performed in any particular order. Further still, to the extent that any elements are described above or recited in the appended claims in a singular form, those skilled in the art will appreciate that singular form(s) contemplate the plural as well unless limitation to the singular form(s) is explicitly stated.

What is claimed is:

1. A method for memory calibration, comprising:
   scheduling a ZQ calibration short (ZQCS) command to calibrate a multi-rank double data rate (DDR) memory system according to a ZQ interval;
   recording that a dynamic random-access memory (DRAM) rank in the multi-rank DDR memory system missed the ZQCS command in response to determining that the DRAM rank was is in a self-refresh mode at the ZQ interval; and
   scheduling a ZQ command to calibrate the DRAM rank after exiting the self-refresh mode based at least in part on a number of ZQCS commands that were missed while the DRAM rank was in the self-refresh mode.

2. The method recited in claim 1, wherein scheduling the ZQ command to calibrate the DRAM rank after exiting the self-refresh mode comprises scheduling another ZQCS command in a next ZQ interval in response to the number of missed ZQCS commands being below a first threshold.

3. The method recited in claim 1, wherein scheduling the ZQ command to calibrate the DRAM rank after exiting the self-refresh mode comprises scheduling a ZQ calibration long (ZQCL) command in a next ZQ interval in response to the number of missed ZQ calibration commands reaching a first threshold.

4. The method recited in claim 3, further comprising:
   executing the scheduled ZQCL command at the next ZQ interval in response to the DRAM rank exiting the self-refresh mode before the next ZQ interval; and
   resuming normal ZQ behavior in response to executing the scheduled ZQCL command, wherein resuming the normal ZQ behavior comprises scheduling ZQCS commands to calibrate the DRAM rank according to the ZQ interval.

5. The method recited in claim 3, further comprising:
   recording that the DRAM rank missed the ZQCL command in response to at least one DRAM rank not exiting the self-refresh mode before the next ZQ interval; and
   scheduling another ZQCL command in a next ZQ interval in response to determining that a number of ZQCL commands that the DRAM rank missed while in the self-refresh mode is below a second threshold.

6. The method recited in claim 3, further comprising:
   recording that the DRAM rank missed the ZQCL command in response to at least one DRAM rank not exiting the self-refresh mode before the next ZQ interval; and
   triggering the ZQCL command upon the DRAM rank exiting the self-refresh mode in response to a number of ZQCL commands that the DRAM rank missed while in the self-refresh mode reaching a second threshold, wherein the triggered ZQCL command is executed immediately after the DRAM rank exits the self-refresh mode and before any requests to access the multi-rank DDR memory system.

7. The method recited in claim 6, further comprising skipping a next scheduled ZQ interval following the executed ZQCL command.

8. The method recited in claim 1, wherein the ZQ command is scheduled to compensate variations in voltage and temperature subsequent to a prior ZQ calibration that was completed before the DRAM rank entered the self-refresh mode.

9. The method recited in claim 1, wherein the ZQ command comprises either another ZQCS command or a ZQ calibration long (ZQCL) command.

10. The method recited in claim 1, wherein the ZQCS command completes in fewer clock cycles than a ZQ calibration long (ZQCL) command, and wherein the ZQCL command compensates wider variations in voltage and temperature than the ZQCS command.

11. An apparatus, comprising:
    a double data rate (DDR) memory system comprising multiple dynamic random-access memory (DRAM) ranks; and
    a memory controller coupled to the DDR memory system, wherein the memory controller is configured to:
        schedule a ZQ calibration short (ZQCS) command to calibrate the DDR memory system according to a ZQ interval;
        record that a DRAM rank among the multiple DRAM ranks in the DDR memory system missed the ZQCS command in response to determining that the DRAM rank was is in a self-refresh mode at the ZQ interval; and
        schedule a ZQ command to calibrate the DRAM rank after exiting the self-refresh mode based at least in part on a number of ZQCS commands that were missed while the DRAM rank was in the self-refresh mode.

12. The apparatus recited in claim 11, wherein the memory controller is configured to schedule another ZQCS command to calibrate the DRAM rank in a next ZQ interval in response to the number of missed ZQCS commands being below a first threshold.

13. The apparatus recited in claim 11, wherein the memory controller is configured to schedule a ZQ calibration long (ZQCL) command to calibrate the DRAM rank in a next ZQ interval in response to the number of missed ZQ calibration commands reaching a first threshold.

14. The apparatus recited in claim 13, wherein the memory controller is further configured to:
    execute the scheduled ZQCL command at the next ZQ interval in response to the DRAM rank exiting the self-refresh mode before the next ZQ interval; and
    resume normal ZQ behavior to schedule ZQCS commands according to the ZQ interval in response to executing the scheduled ZQCL command.

15. The apparatus recited in claim 13, wherein the memory controller is further configured to:
    record that the DRAM rank missed the ZQCL command in response to at least one DRAM rank not exiting the self-refresh mode before the next ZQ interval; and
    schedule another ZQCL command in a next ZQ interval in response to the DRAM rank missing a number of ZQCL commands that reaches a second threshold before exiting the self-refresh mode.

16. The apparatus recited in claim 13, wherein the memory controller is further configured to:
    record that the DRAM rank missed the ZQCL command in response to at least one DRAM rank not exiting the self-refresh mode before the next ZQ interval; and
    trigger the ZQCL command upon the DRAM rank exiting the self-refresh mode in response to a number of ZQCL commands that the DRAM rank missed while in the self-refresh mode reaching a second threshold, wherein the triggered ZQCL command is executed immediately after the DRAM rank exits the self-refresh mode and before any requests to access the DDR memory system.

17. The apparatus recited in claim 16, wherein the memory controller is further configured to skip a next scheduled ZQ interval following the executed ZQCL command.

18. The apparatus recited in claim 11, wherein the ZQ command is scheduled to compensate variations in voltage and temperature subsequent to a prior ZQ calibration that was completed before the DRAM rank entered the self-refresh mode.

19. The apparatus recited in claim 11, wherein the ZQ command comprises either another ZQCS command or a ZQ calibration long (ZQCL) command.

20. The apparatus recited in claim 11, wherein the ZQCS command completes in fewer clock cycles than a ZQ calibration long (ZQCL) command, and wherein the ZQCL command compensates wider variations in voltage and temperature than the ZQCS command.

21. An apparatus, comprising:
  means for scheduling a ZQ calibration short (ZQCS) command to calibrate a multi-rank double data rate (DDR) memory system according to a ZQ interval;
  means for recording that a dynamic random-access memory (DRAM) rank in the multi-rank DDR memory system missed the ZQCS command in response to determining that the DRAM rank was is in a self-refresh mode at the ZQ interval; and
  means for scheduling a ZQ command to calibrate the DRAM rank after exiting the self-refresh mode based at least in part on a number of ZQCS commands that were missed while the DRAM rank was in the self-refresh mode.

22. The apparatus recited in claim 21, wherein the means for scheduling the ZQ command to calibrate the DRAM rank after exiting the self-refresh mode comprises means for scheduling a ZQ calibration long (ZQCL) command in a next ZQ interval in response to the number of missed ZQ calibration commands reaching a first threshold.

23. The apparatus recited in claim 22, further comprising:
  means for executing the scheduled ZQCL command at the next ZQ interval in response to the DRAM rank exiting the self-refresh mode before the next ZQ interval; and
  means for resuming normal ZQ behavior in response to executing the scheduled ZQCL command, wherein resuming the normal ZQ behavior comprises scheduling ZQCS commands to calibrate the DRAM rank according to the ZQ interval.

24. The apparatus recited in claim 22, further comprising:
  means for recording that the DRAM rank missed the ZQCL command in response to at least one DRAM rank not exiting the self-refresh mode before the next ZQ interval; and
  means for triggering the ZQCL command upon the DRAM rank exiting the self-refresh mode in response to a number of ZQCL commands that the DRAM rank missed while in the self-refresh mode reaching a second threshold, wherein the triggered ZQCL command is executed immediately after the DRAM rank exits the self-refresh mode and before any requests to access the multi-rank DDR memory system.

25. The apparatus recited in claim 24, further comprising means for skipping a next scheduled ZQ interval following the executed ZQCL command.

26. A non-transitory computer-readable storage medium storing computer executable code, comprising code for causing a memory controller to:
  schedule a ZQ calibration short (ZQCS) command to calibrate a multi-rank double data rate (DDR) memory system according to a ZQ interval;
  record that a dynamic random-access memory (DRAM) rank in the multi-rank DDR memory system missed the ZQCS command in response to determining that the DRAM rank was is in a self-refresh mode at the ZQ interval; and
  schedule a ZQ command to calibrate the DRAM rank after exiting the self-refresh mode based at least in part on a number of ZQCS commands that were missed while the DRAM rank was in the self-refresh mode.

27. The non-transitory computer-readable storage medium recited in claim 26, wherein the code for causing the memory controller to schedule the ZQ command to calibrate the DRAM rank after exiting the self-refresh mode comprises code for causing the memory controller to schedule a ZQ calibration long (ZQCL) command in a next ZQ interval in response to the number of missed ZQ calibration commands reaching a first threshold.

28. The non-transitory computer-readable storage medium recited in claim 27, further comprising code for causing the memory controller to:
  execute the scheduled ZQCL command at the next ZQ interval in response to the DRAM rank exiting the self-refresh mode before the next ZQ interval; and
  resume normal ZQ behavior in response to executing the scheduled ZQCL command, wherein resuming the normal ZQ behavior comprises scheduling ZQCS commands to calibrate the DRAM rank according to the ZQ interval.

29. The non-transitory computer-readable storage medium recited in claim 27, further comprising code for causing the memory controller to:
  record that the DRAM rank missed the ZQCL command in response to at least one DRAM rank not exiting the self-refresh mode before the next ZQ interval; and
  trigger the ZQCL command upon the DRAM rank exiting the self-refresh mode in response to a number of ZQCL commands that the DRAM rank missed while in the self-refresh mode reaching a second threshold, wherein the triggered ZQCL command is executed immediately after the DRAM rank exits the self-refresh mode and before any requests to access the multi-rank DDR memory system.

30. The non-transitory computer-readable storage medium recited in claim 29, further comprising code for causing the memory controller to skip a next scheduled ZQ interval following the executed ZQCL command executed.

* * * * *